(12) United States Patent
Jensen

(10) Patent No.: US 10,820,428 B2
(45) Date of Patent: Oct. 27, 2020

(54) ATTACHMENT APPARATUS AND METHODS FOR USE

(71) Applicant: The Boeing Company, Chicago, IL (US)

(72) Inventor: Charles C. Jensen, Everett, WA (US)

(73) Assignee: THE BOEING COMPANY, Chicago, IL (US)

( * ) Notice: Subject to any disclaimer, the term of this patent is extended or adjusted under 35 U.S.C. 154(b) by 204 days.

(21) Appl. No.: 15/635,831

(22) Filed: Jun. 28, 2017

(65) Prior Publication Data

US 2019/0008057 A1    Jan. 3, 2019

(51) Int. Cl.
| | | |
|---|---|---|
| H05K 5/00 | (2006.01) | |
| H05K 5/02 | (2006.01) | |
| F21V 5/04 | (2006.01) | |
| B32B 43/00 | (2006.01) | |

(52) U.S. Cl.
CPC .......... *H05K 5/0026* (2013.01); *B32B 43/00* (2013.01); *F21V 5/04* (2013.01); *H05K 5/0217* (2013.01); *H05K 5/0247* (2013.01)

(58) Field of Classification Search
CPC .. H05K 5/0026; H05K 5/0247; H05K 5/0217; F21V 5/04
See application file for complete search history.

(56) References Cited

U.S. PATENT DOCUMENTS

| | | | | |
|---|---|---|---|---|
| 4,546,419 | A * | 10/1985 | Johnson | F21S 8/02 200/310 |
| 5,632,551 | A * | 5/1997 | Roney | B60Q 1/2696 362/485 |
| 5,655,830 | A * | 8/1997 | Ruskouski | G09F 13/04 257/E25.028 |
| 5,738,436 | A * | 4/1998 | Cummings | F21S 8/026 362/294 |
| 6,375,338 | B1 * | 4/2002 | Cummings | F21S 8/026 362/276 |
| 7,008,084 | B2 * | 3/2006 | Galli | F21L 4/027 361/715 |
| 7,762,701 | B2 * | 7/2010 | Luo | F21K 9/00 362/545 |
| 8,696,168 | B2 * | 4/2014 | Li | F21V 23/006 362/249.02 |
| 8,733,966 | B2 * | 5/2014 | Maglica | F21L 4/027 362/202 |
| 9,073,267 | B1 | 7/2015 | Badgley et al. | |
| 9,107,325 | B1 | 8/2015 | Ihn et al. | |
| 9,285,082 | B2 * | 3/2016 | Athalye | F21V 29/70 |

(Continued)

Primary Examiner — Jinhee J Lee
Assistant Examiner — Theron S Milliser
(74) Attorney, Agent, or Firm — McDonnell Boehnen Hulbert & Berghoff LLP

(57) ABSTRACT

An example assembly includes a composite sandwich panel that further includes a facing, a hole defined by a perimeter, and electrical circuitry on the facing. The assembly further includes an electrical component and an insert. The insert is positioned within the hole and includes a first attachment component. The assembly further includes a cap that includes a second attachment component that is releasably attachable to the first attachment component through the hole to electrically couple the electrical component to the electrical circuitry and mechanically couple the electrical component to the facing.

20 Claims, 10 Drawing Sheets

(56) References Cited

U.S. PATENT DOCUMENTS

| | | | |
|---|---|---|---|
| 9,488,322 B2* | 11/2016 | Athalye | F21K 9/232 |
| 2005/0057187 A1* | 3/2005 | Catalano | F21V 23/003 |
| | | | 315/291 |
| 2007/0064450 A1* | 3/2007 | Chiba | B60Q 1/2696 |
| | | | 362/655 |
| 2008/0143234 A1* | 6/2008 | Yu | F21V 17/06 |
| | | | 313/318.08 |
| 2009/0034283 A1* | 2/2009 | Albright | F21V 29/004 |
| | | | 362/545 |
| 2009/0189169 A1* | 7/2009 | Wei | F21V 29/004 |
| | | | 257/98 |
| 2011/0101861 A1* | 5/2011 | Yoo | F21V 3/02 |
| | | | 315/35 |
| 2011/0109217 A1* | 5/2011 | Kang | F21V 29/004 |
| | | | 313/46 |
| 2011/0273895 A1* | 11/2011 | Uemoto | F21V 23/009 |
| | | | 362/430 |
| 2011/0308839 A1* | 12/2011 | Eguchi | H05K 1/03 |
| | | | 174/250 |
| 2012/0170262 A1* | 7/2012 | Hoetzl | F21V 29/004 |
| | | | 362/227 |
| 2012/0236563 A1* | 9/2012 | Breidenassel | F21V 17/12 |
| | | | 362/249.02 |
| 2013/0301013 A1* | 11/2013 | Samejima | G03B 21/2033 |
| | | | 353/52 |
| 2013/0301259 A1* | 11/2013 | Ahn | F21V 29/02 |
| | | | 362/235 |
| 2014/0016302 A1* | 1/2014 | Shin | H05K 5/0017 |
| | | | 362/97.1 |
| 2014/0098539 A1* | 4/2014 | Inaba | F21V 5/04 |
| | | | 362/277 |
| 2015/0078005 A1* | 3/2015 | Renn | F21V 23/005 |
| | | | 362/294 |
| 2015/0167931 A1* | 6/2015 | Borgarelli | F21V 7/00 |
| | | | 362/297 |
| 2015/0276173 A1* | 10/2015 | Vasta | F21V 31/00 |
| | | | 362/294 |
| 2015/0300619 A1* | 10/2015 | Reier | F21V 29/503 |
| | | | 362/249.02 |
| 2015/0342077 A1 | 11/2015 | Dalal et al. | |
| 2015/0377469 A1* | 12/2015 | Marinus | F21V 5/04 |
| | | | 362/373 |
| 2016/0003344 A1* | 1/2016 | Mapkar | F16H 57/037 |
| | | | 428/35.8 |
| 2016/0281935 A1* | 9/2016 | Yang | F21V 29/70 |

* cited by examiner

ATTACHMENT APPARATUS AND METHODS FOR USE

FIELD

The present disclosure generally relates to attachment components, and more specifically to an apparatus for electrically and mechanically coupling an electrical component to a composite sandwich panel.

BACKGROUND

In various applications, it may be useful to mechanically and/or electrically couple an electrical component to a panel (e.g., a composite sandwich panel) or a similar structure. Such an electrical component might take the form of a light source, a light emitting diode (LED), a sensor, a button, a switch, or an actuator. For example, a technician may secure the electrical component within a hole having a desirable position relative to other components attached to the panel or in a position that is convenient for a user. To this end, a technician may solder electrical leads of the electrical component to wiring that is attached to the panel. Additionally, the technician may bond the electrical component to the hole in the panel with adhesive.

Mechanically and electrically coupling the electrical component to the panel in this way includes several disadvantages. For instance, it generally requires considerable time and effort for the technician to apply adhesive to the hole in the panel and/or the electrical component, wait for the adhesive to dry, and perform the soldering. Additionally, the weight of the electrical component might be too large to be reliably supported by an adhesive bond to the hole having a surface area limited by the thickness of the panel. Another drawback is that the electrical component, once adhesively bonded to the panel, is generally not removable without damaging the panel.

Accordingly, there is a need for an apparatus and/or a method for mechanically and electrically coupling electrical components to a composite sandwich panel or other panels in a way that requires less time and effort, yields better structural support of the electrical component, enables quicker and less destructive removal of the electrical component, and leads to less waste of panel materials.

SUMMARY

In one example, an assembly is described that includes a composite sandwich panel that further includes a facing, a hole defined by a perimeter, and electrical circuitry on the facing. The assembly further includes an electrical component and an insert. The insert is positioned within the hole and includes a first attachment component. The assembly further includes a cap that includes a second attachment component that is attached to the first attachment component through the hole to electrically couple the electrical component to the electrical circuitry and mechanically couple the electrical component to the facing.

In another example, an apparatus for attaching an electrical component to a composite sandwich panel is described. The apparatus includes an insert that includes a first attachment component having a ridge that at least partially encircles a longitudinal axis of the apparatus. The apparatus further includes a cap that includes a second attachment component that is releasably attachable to the first attachment component through a hole in a composite sandwich panel inside of which the insert is positioned. The second attachment component includes two or more tabs configured to be placed under respective portions of the ridge and to exert a radial force directed away from the longitudinal axis.

In another example, a method is described for attaching an electrical component to a composite sandwich panel. The method includes positioning an insert within a hole in a composite sandwich panel. A facing of the composite sandwich panel includes electrical circuitry thereon and the insert includes a first attachment component. The method further includes pressing a cap onto the facing such that the first attachment component of the insert attaches to a second attachment component of the cap through the hole, thereby pressing an electrical component against the electrical circuitry on the facing to electrically couple the electrical component to the electrical circuitry and mechanically couple the electrical component to the facing.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying Figures.

DETAILED DESCRIPTION

Figure 1:
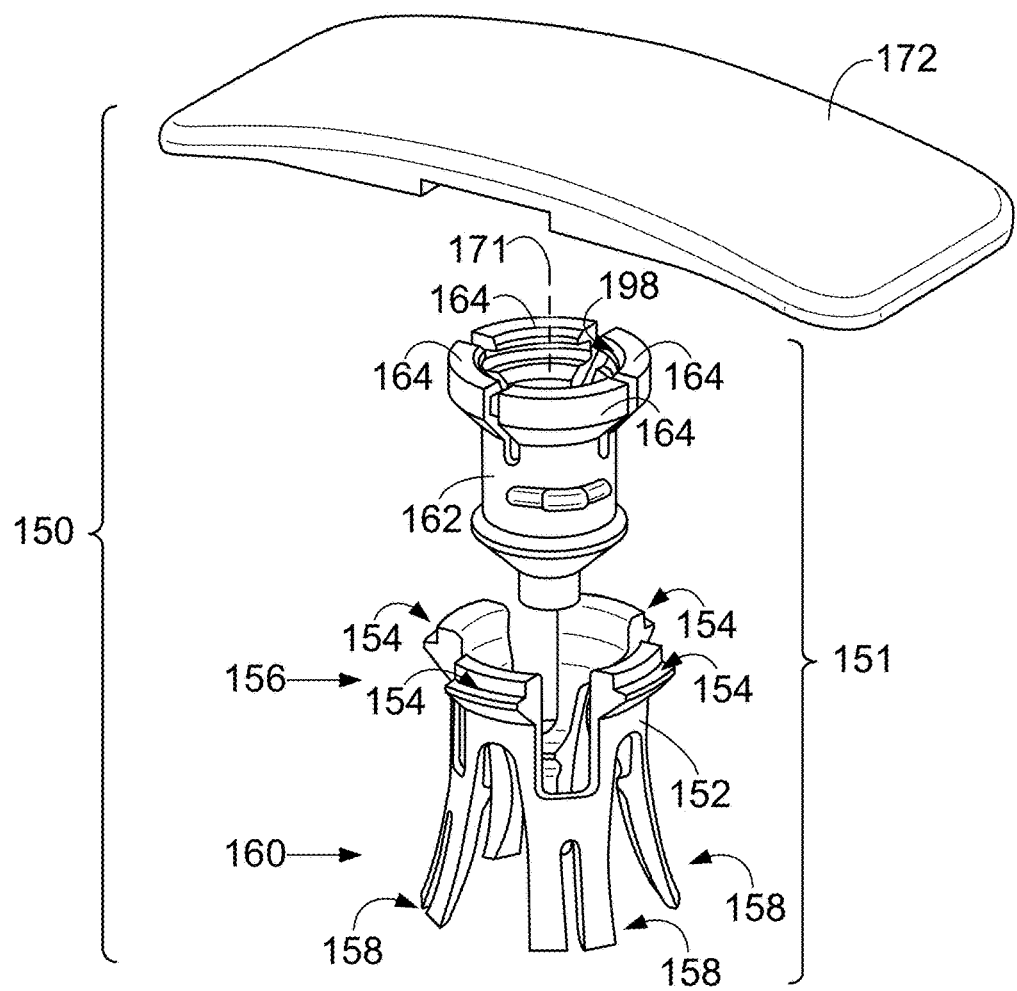
FIG. 1 is an exploded view of an apparatus including an insert, according to an example embodiment.

As discussed above, there exists a need for improved apparatus or methods for mechanically and electrically coupling electrical components to a composite sandwich panel or other panels. Accordingly, such apparatus and methods are disclosed herein.

Composite sandwich panels are generally formed by attaching two thin and flat facings (e.g., skins) to opposing sides of a thicker core material. The facings may be formed of laminates of glass, thermoset polymers, carbon fiber-reinforced thermoplastics, or sheet metal, for example. Materials commonly used as a core material include open or closed-cell-structured foams such as polyethersulfone, polyvinylchloride, polyurethane, polyethylene or polystyrene foams, syntactic foams, balsa wood, or honeycomb structures (e.g., paper or cardboard formed into honeycomb structures). Composite sandwich panels can be used in any application where lightweight yet strong panel structures are desirable.

Within examples, an assembly includes a composite sandwich panel that further includes a facing, a hole defined by a perimeter, and electrical circuitry (e.g., printed circuitry) on the facing. The assembly further includes an electrical component, such as a light source, and an insert that is positioned within the hole. The insert includes a first attachment component.

The assembly further includes a cap that includes a second attachment component (e.g., two opposing tabs) that is attached to the first attachment component through the hole to electrically couple the electrical component to the electrical circuitry and mechanically couple the electrical component to the facing.

Coupling the electrical component to the composite sandwich panel in this way has several advantages. First, since the assembly utilizes components that attach to each other from opposite sides of the facing of the composite sandwich panel, installation takes considerably less time and effort as compared to previous methods. Additionally, depending on the geometry of the electrical component, its weight and the clasping force of the cap and insert can be distributed over a relatively large area of the facing of the composite sandwich panel, making structural failure of the panel less likely. Further, the assembly can be unassembled without damaging the panel's facing, which enables more convenient replacement of electrical components on the panel's facing.

Disclosed embodiments will now be described more fully hereinafter with reference to the accompanying Drawings, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

By the term "about" or "substantially" with reference to amounts or measurement values described herein, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

FIG. 1 is an exploded view of an apparatus 150. The apparatus 150 includes an insert 151 that further includes an outer structure 152 and an inner structure 162. The apparatus 150 also includes a cap 172.

The outer structure 152 may be formed of plastic or other flexible materials and include a third attachment component 154 at an end 156 of the outer structure 152. The third attachment component 154 is shown with a discontinuous circular shape, but other examples are possible. The outer structure 152 may also include two or more arms 158 at an end 160 of the outer structure 152. The arms 158 may curve radially outward toward the end 160, but other examples are possible.

The inner structure 162 may also be formed of plastic or other materials and include a first attachment component 164. The first attachment component 164 has a discontinuous circular form, but other examples are possible. The inner structure 162 is configured to be inserted into the outer structure 152 to cause the third attachment component 154 to expand outward against a perimeter of a hole within a composite sandwich panel inside of which the insert 151 is positioned.

Figure 2:
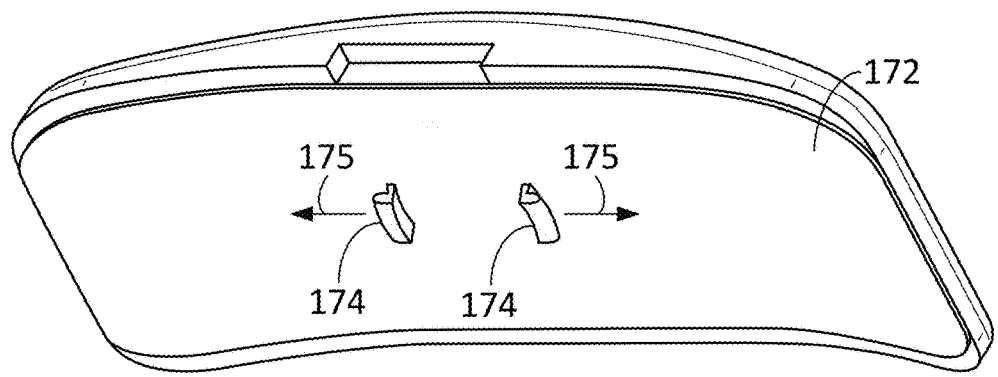
FIG. 2 is an underside view of a cap of the apparatus of FIG. 1, according to an example embodiment.

FIG. 2 is an underside view of the cap 172 of the apparatus 150. The cap 172 may also be formed of plastic or other materials and further include a second attachment component 174 that is configured to be attached to the first attachment component 164. The second attachment component 174 may include two or more tabs configured to exert an opposing force 175 when pressed together, but other examples are possible. The first attachment component 164 may include a ridge 198 that at least partially encircles a longitudinal axis 171 of the apparatus 150. The second attachment component 174 may include two or more tabs configured to be placed under respective portions of the ridge 198 and to exert a radial force 175 directed away from the longitudinal axis 171 (see FIGS. 1 and 2).

To recap, the apparatus 150 for attaching an electrical component 114 to a composite sandwich panel 103 (see FIG. 10) includes an insert 151 comprising a first attachment component 164 having a ridge 198 that at least partially encircles a longitudinal axis 171 of the apparatus 150. The apparatus 150 further includes a cap 172 that includes a second attachment component 174 that is releasably attachable to the first attachment component 164 through a hole 108 in a composite sandwich panel 103 inside of which the insert 151 is positioned. The second attachment component 174 comprises two or more tabs configured to be placed under respective portions of the ridge 198 and to exert a radial force 175 directed away from the longitudinal axis 171.

Figure 3:
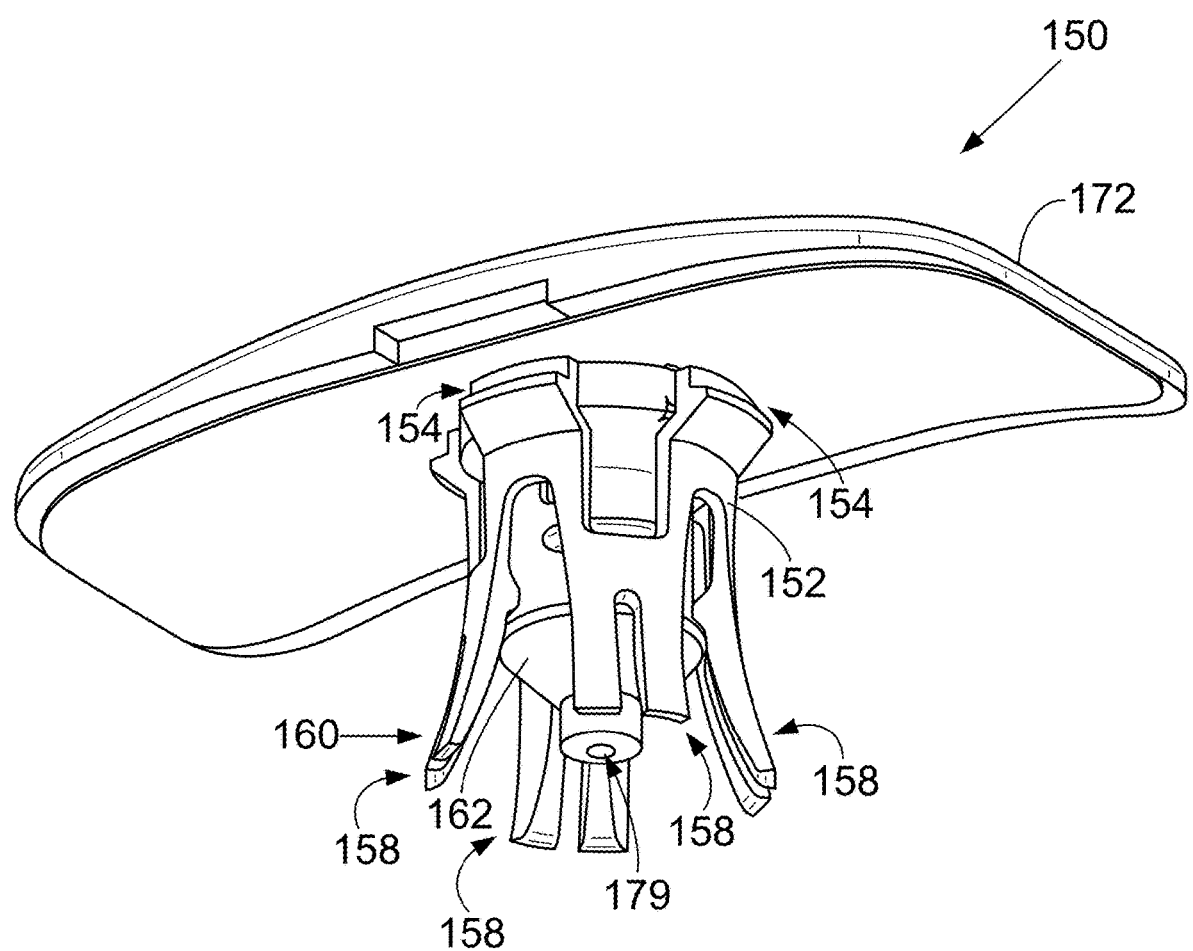
FIG. 3 is an underside view of the apparatus of FIG. 1 in an assembled state, according to an example embodiment.

FIG. 3 is an underside view of the apparatus 150 in an assembled state in which the inner structure 162 is inserted into the outer structure 152, thereby causing the third attachment component 154 to expand compared to what is shown in FIG. 1. In the assembled state of FIG. 3, the second attachment component 174 of the cap 172 is also attached to the first attachment component 164 of the inner structure 162 (not shown in FIG. 3). The inner structure 162 includes a hole 179 (e.g., an optical aperture) at a bottom end of the inner structure 162 that will be explained in more detail below.

Figure 4:
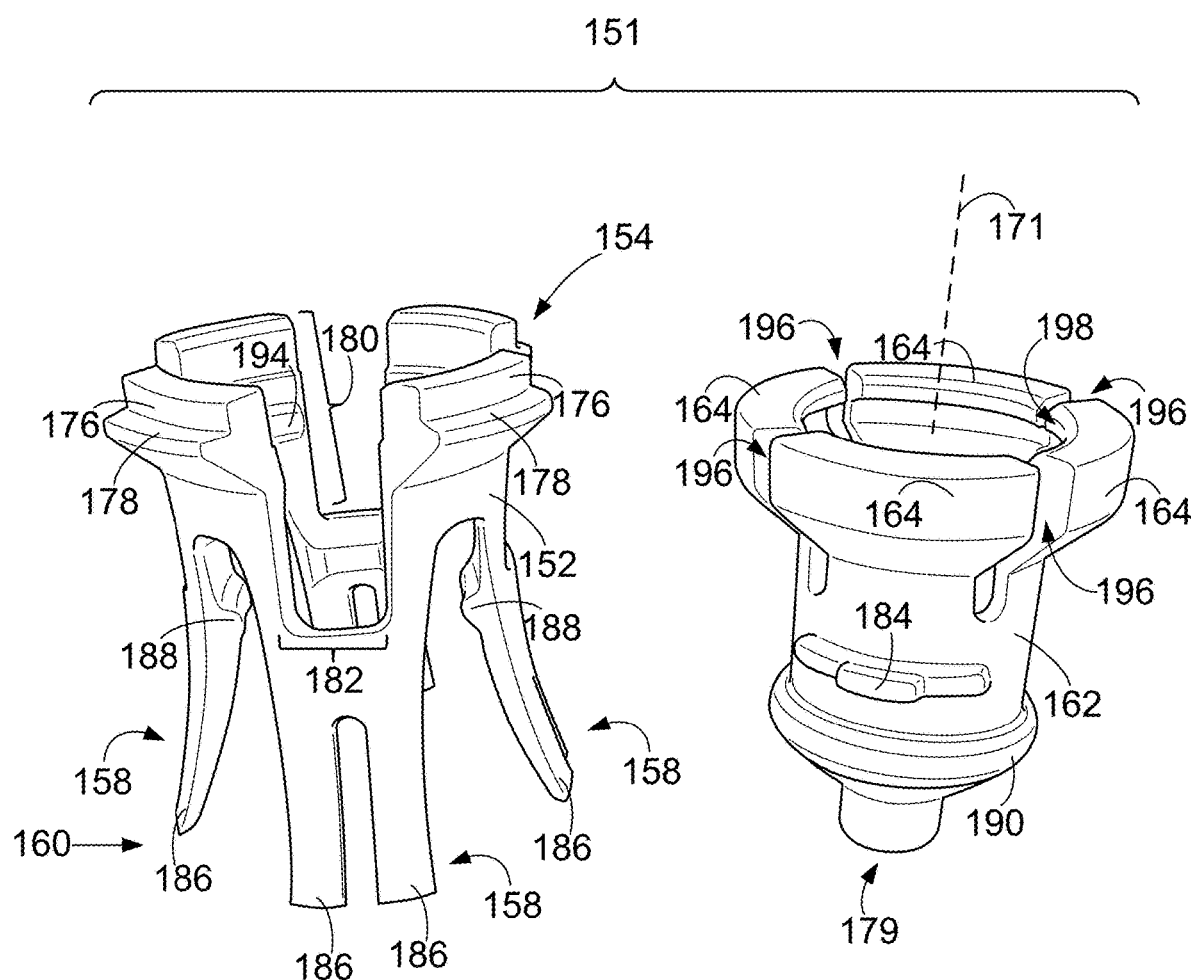
FIG. 4 is a front view of an outer structure and an inner structure of the insert of FIG. 1, according to an example embodiment.

FIG. 4 is a front view of the insert 151. The third attachment component 154 includes one or more first faces 176 that are configured to be substantially parallel to the perimeter 110 of the hole 108 (see FIG. 12). The third attachment component 154 may also include one or more second faces 178 that are substantially perpendicular to respective faces of the one or more first faces 176. This may enable coupling of the electrical component 114 mechanically and/or electrically to the first side 104 of the facing 102.

The third attachment component 154 may include two or more tabs 180 that are separated by one or more gaps 182. The separation of the tabs 180 may provide the third attachment component 154 with flexibility that enables attachment to other components such as a composite sandwich panel. Additionally, the one or more gaps 182 may be configured to receive one or more respective tabs 184 of the inner structure 162 as the inner structure 162 is inserted into the outer structure 152. The two or more arms 158 of the outer structure 152 may each include two or more (e.g., flexible) prongs 186 that curve radially outward toward the end 160.

In addition to the tabs 184, the inner structure 162 may include a ring-shaped protrusion 190 that is configured to guide movement of the inner structure 162 through the outer structure 152. As shown, the attachment component 164 includes two or more sections that are separated by one or more gaps 196. The separation provided by the gaps 196 may provide the first attachment component 164 with flexibility that enables attachment to other components, such as the second attachment component 174.

Figure 5:
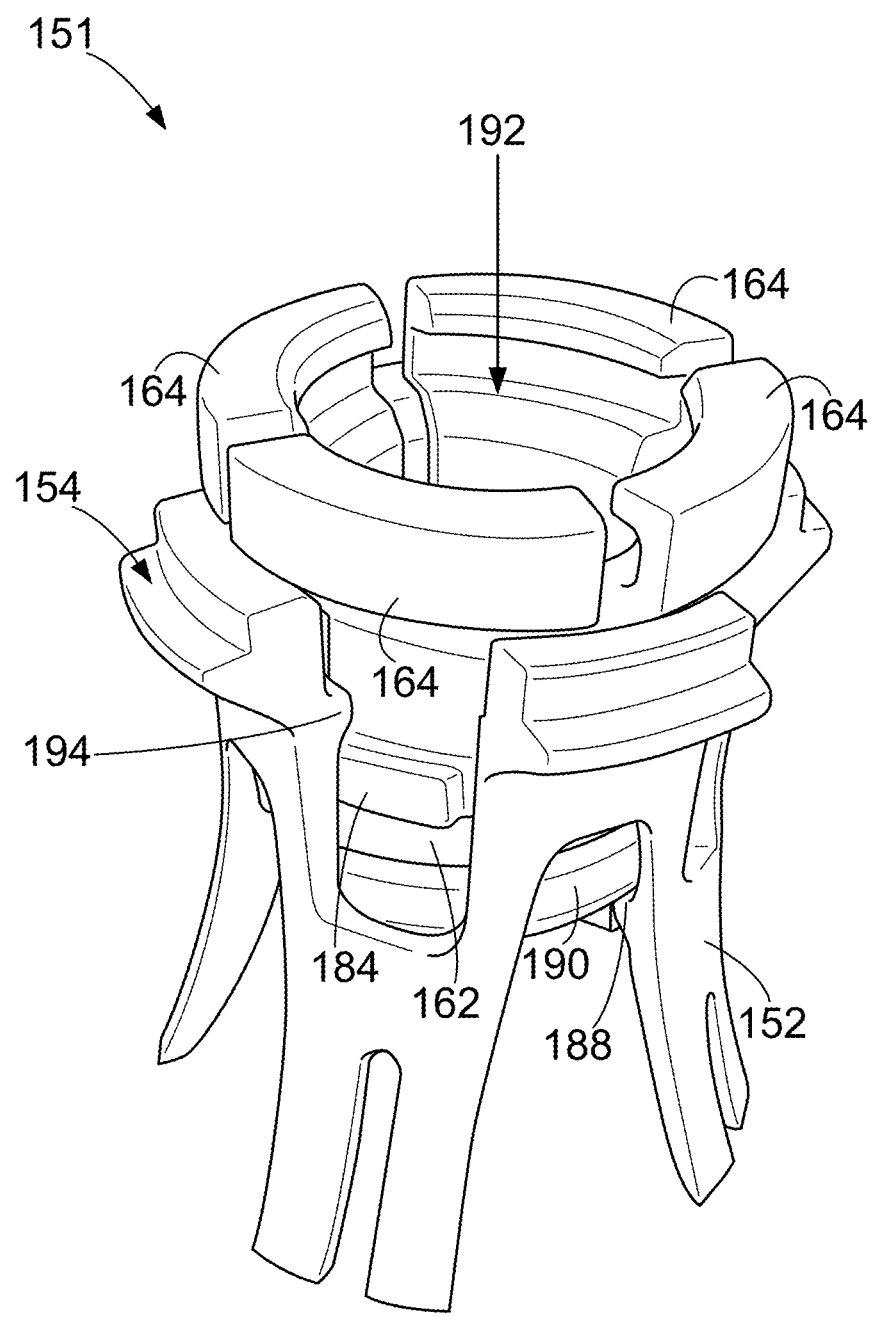
FIG. 5 is a front view of the inner structure of FIG. 4 inserted into the outer structure of FIG. 4 such that the outer structure is in a contracted state, according to an example embodiment.

FIG. 5 is a front view of the inner structure 162 partially inserted into the outer structure 152 such that the third attachment component 154 is in a contracted state. In the contracted state, the first attachment component 164 may be completely above the third attachment component 154.

As shown in FIGS. 4 and 5, the outer structure 152 may include one or more protrusions 188 configured to resist movement of the protrusion 190 of the inner structure 162 past the one or more protrusions 188 in response to an axial force 192 applied to the inner structure 162 of magnitude that is less than a predetermined threshold. The one or more protrusions 188 may be further configured to allow movement of the protrusion 190 of the inner structure 162 past the one or more protrusions 188 in response to an axial force 192 applied to the inner structure 162 of magnitude that is greater than the predetermined threshold (see FIG. 6).

Figure 6:
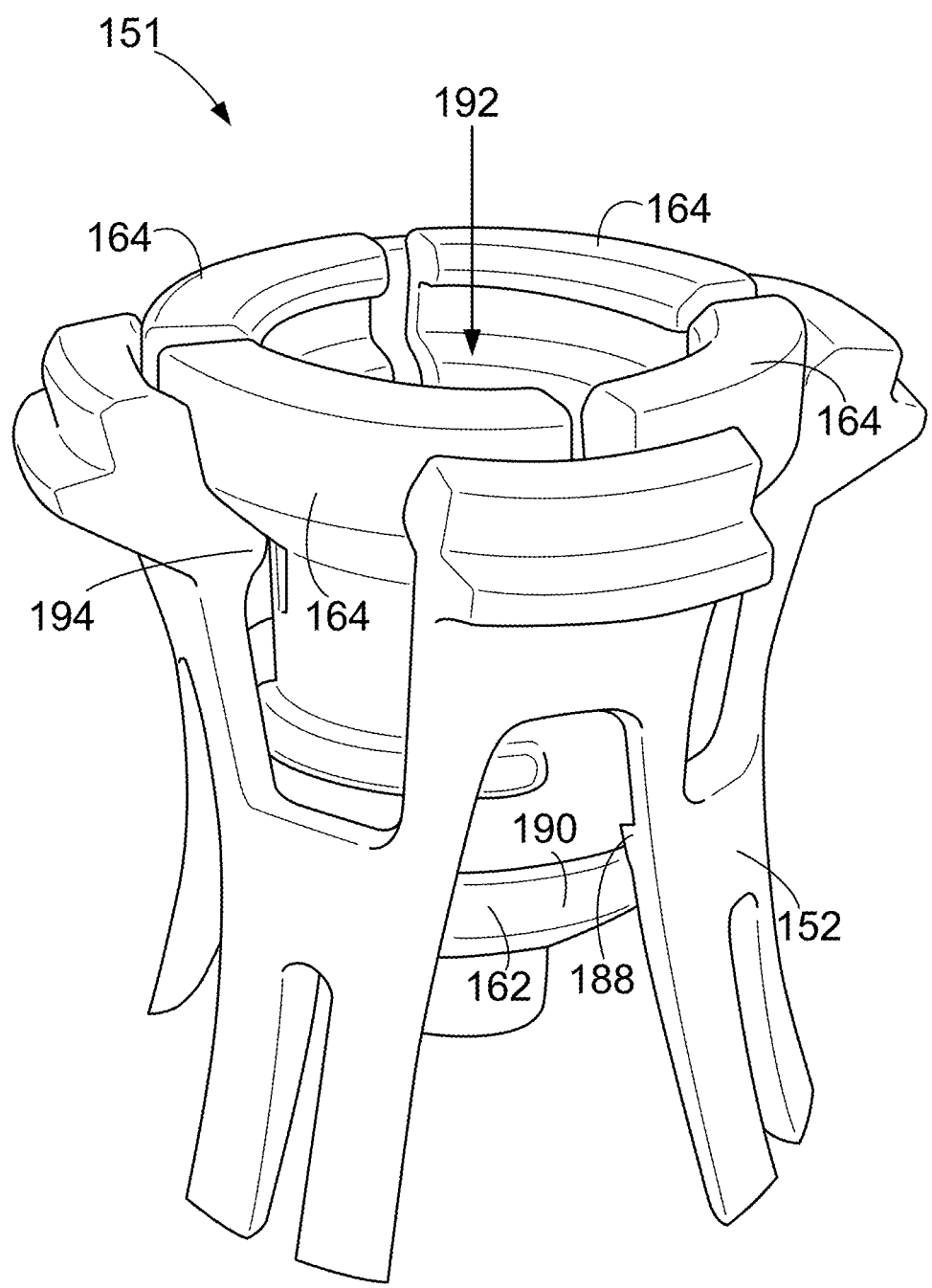
FIG. 6 is a front view of the inner structure of FIG. 4 inserted into the outer structure of FIG. 4 such that the outer structure is in an expanded state, according to an example embodiment.
Figure 10:
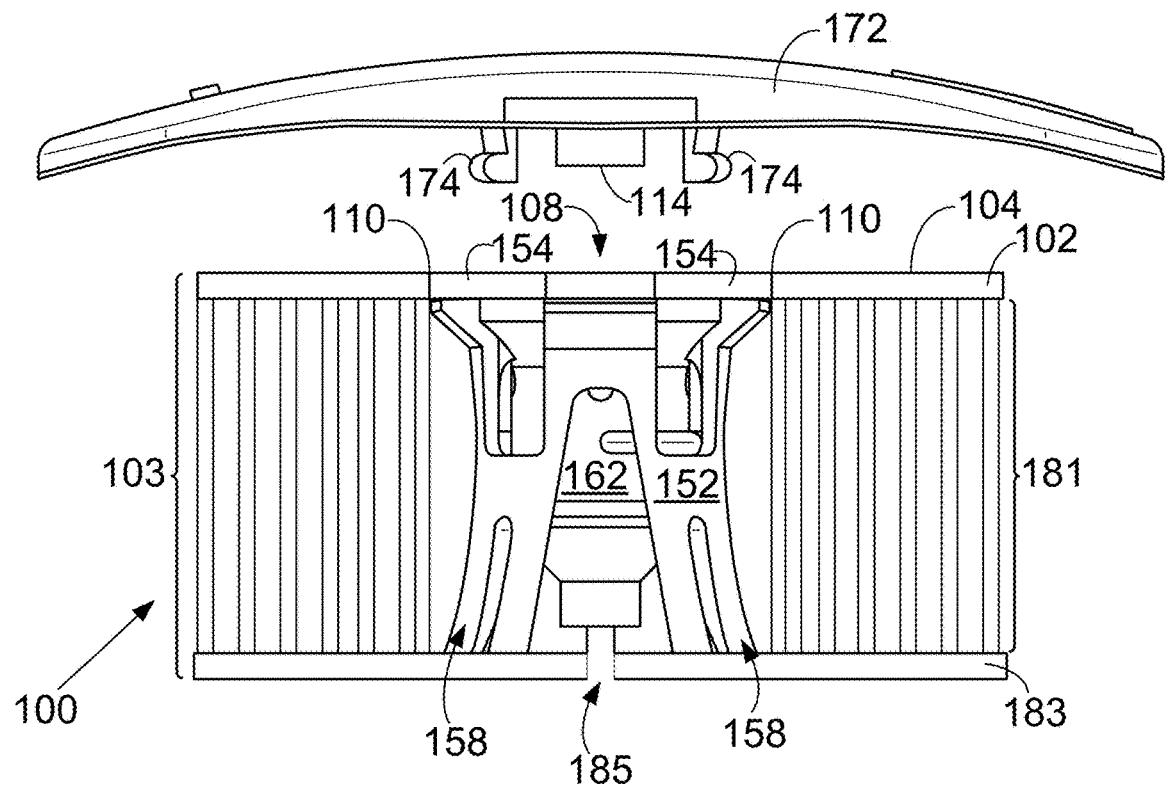
FIG. 10 is a front view of the components shown in FIG. 9, including a honeycomb structure of the composite sandwich panel, according to an example embodiment.

FIG. 6 is a front view of the inner structure 162 fully inserted into the outer structure 152 such that the third attachment component 154 is in an expanded state in which the third attachment component 154 is configured to expand outward against the perimeter 110 of the hole 108 within the composite sandwich panel 103 (see FIG. 10). In some examples, the third attachment component 154 is configured to apply an expansive force against the perimeter 110. In the expanded state, a portion of the first attachment component 164 may extend above the third attachment component 154.

As shown in FIG. 6, the outer structure 152 may include one or more protrusions 194 configured to prevent movement of the first attachment component 164 beyond the protrusions 194.

Figure 7:
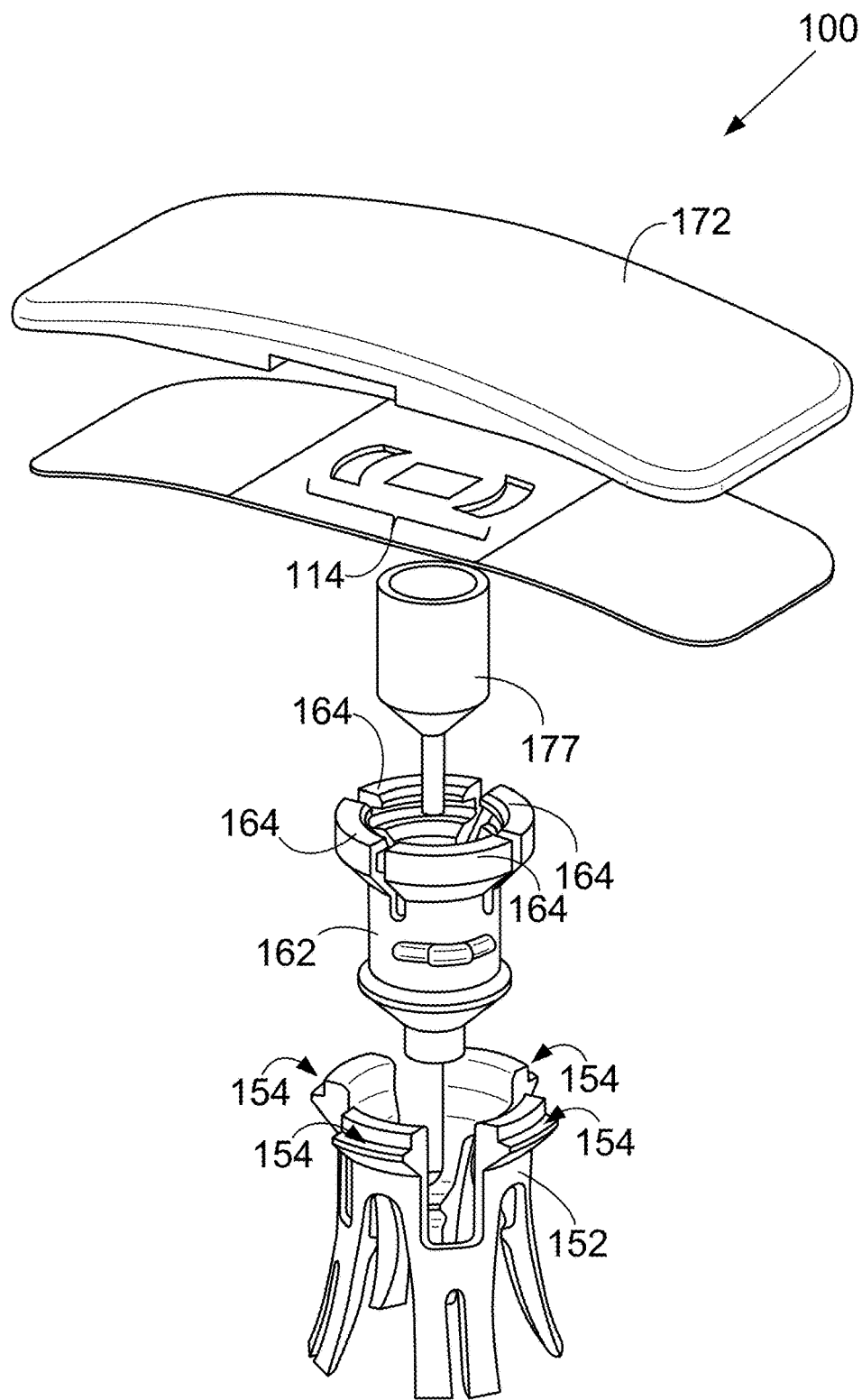
FIG. 7 is an exploded view of portions of an assembly, including the insert of FIGS. 4-6, according to an example embodiment.
Figure 8:
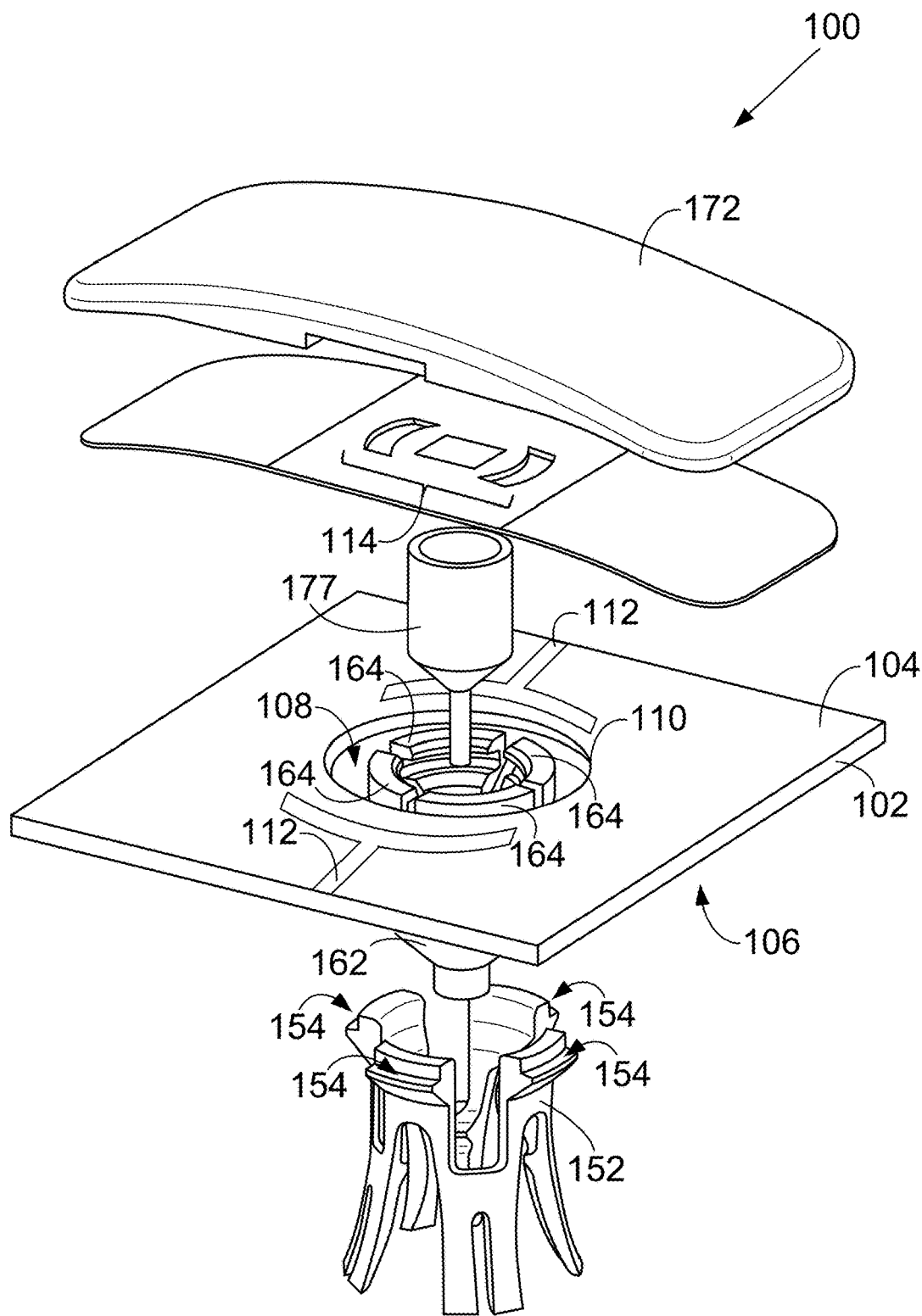
FIG. 8 is an exploded view of the assembly of FIG. 7, including a facing of a composite sandwich panel, according to an example embodiment.

FIG. 7 is an exploded view of portions of an assembly 100. FIG. 8 additionally shows a facing 102 of a composite sandwich panel 103 of the assembly 100 (see FIG. 10). As shown in FIGS. 8-11, the assembly 100 includes the composite sandwich panel 103 which further includes the facing 102, the hole 108 defined by the perimeter 110, an electrical component 114, and the insert 151 having the first attachment component 164. The assembly 100 further includes the cap 172 having the second attachment component 174 that is releasably attachable to the first attachment component 164 within the hole 108 to electrically couple the electrical component 114 to the electrical circuitry 112 and mechanically couple the electrical component 114 to the facing 102.

Referring back to FIG. 8, the facing 102 has a side 104 and an opposing side 106. The side 104 of the facing 102 includes the electrical circuitry 112 (e.g., printed electric circuitry). The assembly 100 further includes an electrical component 114 that takes the form of or includes a light source, a light emitting diode (LED), a sensor, a button, a switch, or an actuator.

The outer structure 152 of the apparatus 150 is positioned on the side 106 of the facing 102. The inner structure 162 is inserted into the outer structure 152 (see FIGS. 9 and 10) to hold the attachment component 154 in an expanded state in which the third attachment component 154 is expanded outward against the perimeter 110 of the hole 108.

As previously noted, the third attachment component 154 may include one or more faces 176 (see FIG. 4) that are substantially parallel to the perimeter 110 of the hole 108 and one or more faces 178 (see FIG. 4) that are substantially parallel to the side 106 of the facing 102.

The second attachment component 174 of the cap 172 is configured to be attached to the first attachment component 164 through the hole 108 to electrically couple the electrical component 114 to the electrical circuitry 112 on the side 104 of the facing 102.

As shown in FIG. 3, the inner structure 162 may include a hole 179 that is opposite the first attachment component 164. In examples in which the electrical component 114 takes the form of a light source, the assembly 100 may further include a lens 177. The electrical component 114 may include a light source, and the inner structure 162 may house the lens 177 (see FIG. 8) such that the light source is optically coupled to the lens 177, and the lens 177 is optically coupled to the hole 179 opposite the first attachment component 164.

Figure 9:
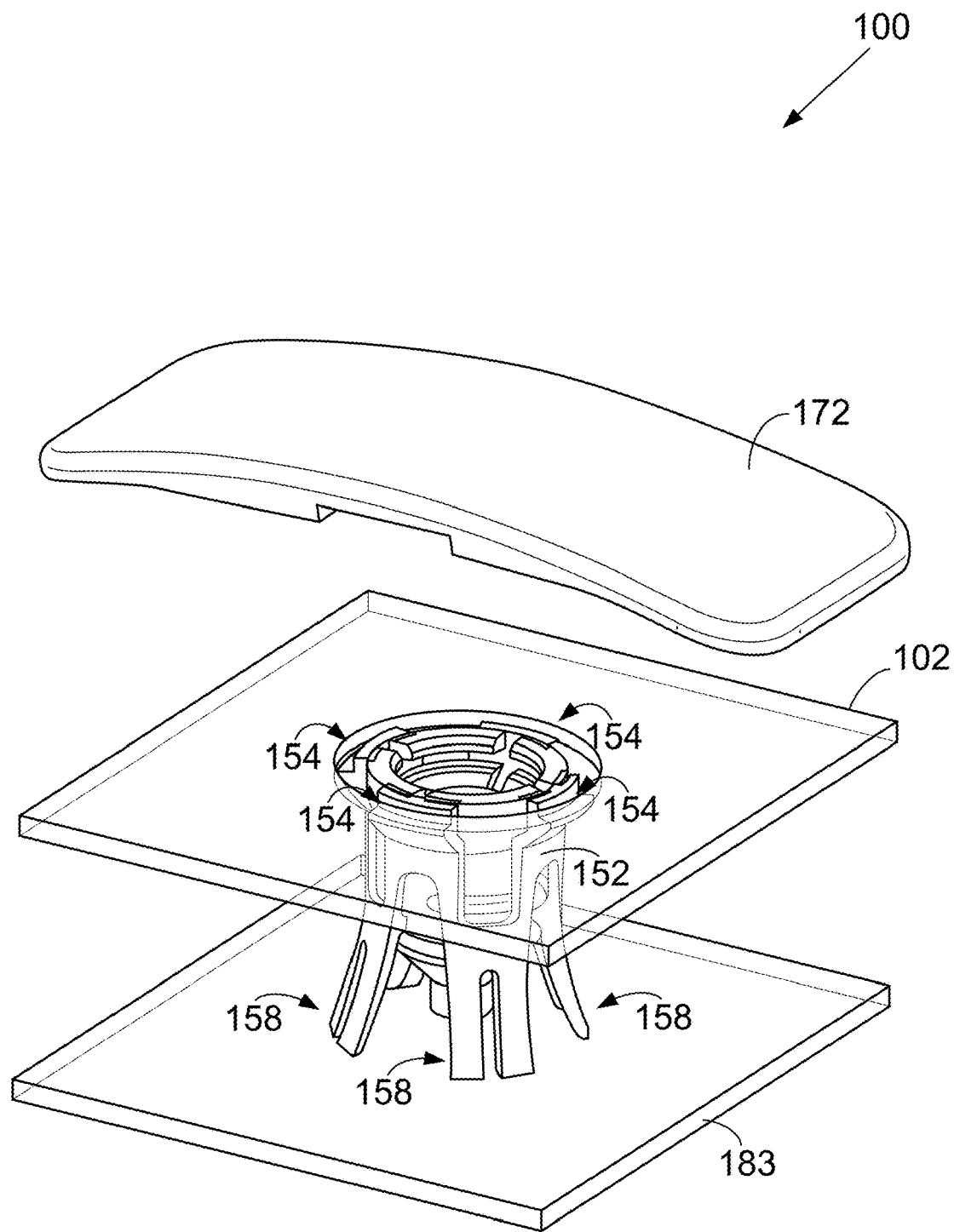
FIG. 9 is a perspective view of the outer structure and inner structure of FIG. 4 installed between two facings of a composite sandwich panel, according to an example embodiment.

FIG. 9 is a perspective view of the outer structure 152 and inner structure 162 installed between the first facing 102 and a second facing 183. As such, the assembly 100 may further include the second facing 183. The outer structure 152 includes two or more arms 158 opposite the third attachment component 154 and the first attachment component 164 that may be compressed against the second facing 183 to press the third attachment component 154 against the first facing 102 and/or against the perimeter 110 of the hole 108. In some examples, the second facing 183 may be an aircraft interior lighting panel that is accessible to a passenger, but other examples are possible.

FIG. 10 is a front view of the assembly 100 in a partially assembled state. The electrical component 114 (e.g., a light source), the lens 177, and the hole 179 may be cooperatively configured to direct light emitted by the electrical component 114 through the hole 185 in the facing 183. A honeycomb structure 181 and the hole 108 within the honeycomb structure 181 are positioned between the facing 102 and the facing 183.

Figure 11:
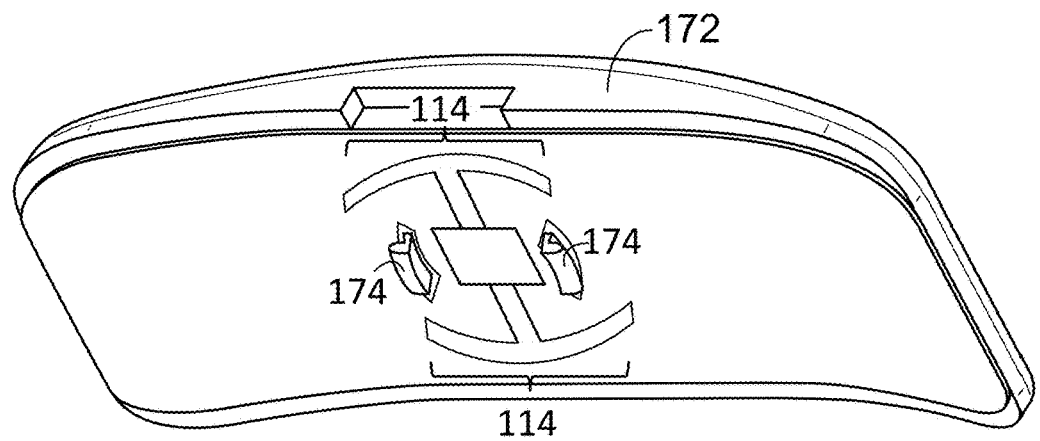
FIG. 11 is an under side view of an electrical component of the assembly of FIGS. 7 and 8, according to an example embodiment.

FIG. 11 is an under side view of the electrical component 114 that is attached to the cap 172 via the attachment component 174. The electrical component 114 may include printed electric circuitry that is configured to be pressed onto the electrical circuitry 112 of the facing 102. In this way, the electric circuitry 112 may provide power to the electrical component 114. In an example where the electrical component 114 takes the form of a light source, the light source may be aligned with the lens 177 (see FIG. 8) when the assembly 100 is fully assembled.

Some examples may include multiple assemblies similar to the assembly 100. Such additional assemblies may be structured similarly to the assembly 100, for example in order to couple additional electrical components electrically and/or mechanically to the composite sandwich panel 103. In such examples, the composite sandwich panel 103 may include additional holes to accommodate the additional assemblies.

Figure 12:
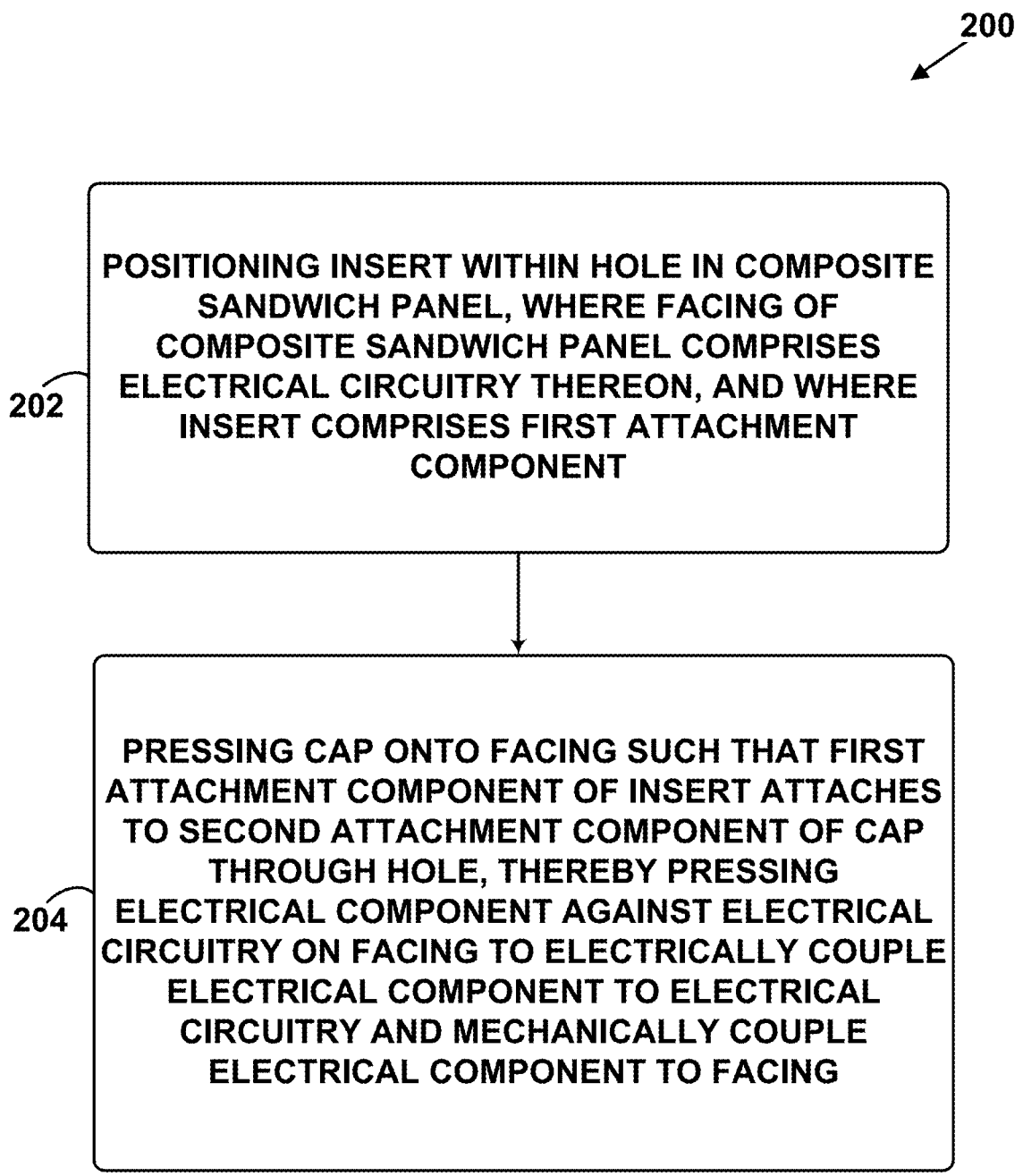
FIG. 12 is a block diagram of a method for attaching an electrical component to a composite sandwich panel, according to an example embodiment.

FIG. 12 is a block diagram of a method 200 for attaching an electrical component to a composite sandwich panel. The method 200 may be used to attach the electrical component 114 to the composite sandwich panel 103, for example.

At block 202, the method 200 includes positioning an insert within a hole in a composite sandwich panel. In this context, a facing of the composite sandwich panel includes electrical circuitry thereon. The insert also includes a first attachment component.

For example, the insert 151 may be positioned within the hole 108 in the composite sandwich panel 103. The facing 102 includes the electrical circuitry 112 thereon. The insert 151 includes the first attachment component 164.

At block 204, the method 200 includes pressing a cap onto the facing such that the first attachment component of the insert attaches to a second attachment component of the cap through the hole, thereby pressing an electrical component against the electrical circuitry on the facing to electrically couple the electrical component to the electrical circuitry and mechanically couple the electrical component to the facing.

For example, the cap 172 may be pressed onto the facing 102 such that the first attachment component 164 of the insert 151 attaches to the second attachment component 174 of the cap 172 through the hole 108, thereby pressing the electrical component 114 against the electrical circuitry 112 on the facing 102 to electrically couple the electrical component 114 to the electrical circuitry 112 and mechanically couple the electrical component 114 to the facing 102.

Embodiments of the present disclosure can thus relate to one of the enumerated example embodiment (EEEs) listed below.

EEE 1 is an assembly comprising: a composite sandwich panel comprising: a facing; a hole defined by a perimeter; and electrical circuitry on the facing; an electrical component; an insert that is positioned within the hole, the insert comprising a first attachment component; and a cap comprising a second attachment component that is releasably attachable to the first attachment component within the hole to electrically couple the electrical component to the electrical circuitry and mechanically couple the electrical component to the facing.

EEE 2 is the assembly of EEE 1, wherein the first attachment component comprises a ridge that at least partially encircles a longitudinal axis of the insert, and wherein the second attachment component comprises two or more tabs configured to be placed under respective portions of the ridge and to exert a radial force directed away from the longitudinal axis.

EEE 3 is the assembly of EEE 1, wherein the insert comprises: an outer structure comprising a third attachment component; and an inner structure comprising the first attachment component, wherein the inner structure is inserted into the outer structure to expand the third attachment component outward against the perimeter of the hole.

EEE 4 is the assembly of EEE 3, wherein the outer structure comprises one or more gaps receiving one or more respective tabs of the inner structure.

EEE 5 is the assembly of EEE 3, further comprising a lens, wherein the inner structure comprises a hole that is opposite the first attachment component, wherein the electrical component comprises a light source, and wherein the inner structure houses the lens such that the light source is optically coupled to the lens, and the lens is optically coupled to the hole opposite the first attachment component.

EEE 6 is the assembly of EEE 1, wherein the first attachment component and the second attachment component are configured to form a snap joint.

EEE 7 is the assembly of EEE 1, wherein the facing is a first facing and the assembly further comprises a second facing opposite the first facing, and wherein the insert comprises two or more arms opposite the first attachment component that are compressed against the second facing.

EEE 8 is the assembly of EEE 7, wherein an arm of the two or more arms comprises two or more prongs.

EEE 9 is the assembly of EEE 7, wherein the composite sandwich panel comprises a honeycomb core between the first facing and the second facing.

EEE 10 is the assembly of EEE 1, wherein the electrical component comprises a light source, a light emitting diode (LED), a sensor, a button, a switch, a microcontroller, a wireless communication device, a battery, or an actuator.

EEE 11 is the assembly of EEE 1, further comprising: a second hole in the composite sandwich panel defined by a perimeter; a second electrical component; a second insert that is positioned within the second hole, the second insert comprising a third attachment component; and a second cap comprising a fourth attachment component that is releasably attachable to the third attachment component through the second hole to electrically couple the second electrical component to the electrical circuitry.

EEE 12 is an apparatus for attaching an electrical component to a composite sandwich panel, the apparatus comprising: an insert comprising a first attachment component having a ridge that at least partially encircles a longitudinal axis of the apparatus; and a cap comprising a second attachment component that is releasably attachable to the first attachment component through a hole in a composite sandwich panel inside of which the insert is positioned, wherein the second attachment component comprises two or more tabs configured to be placed under respective portions of the ridge and to exert a radial force directed away from the longitudinal axis.

EEE 13 is the apparatus of EEE 12, wherein the insert comprises: an outer structure comprising a third attachment component; and an inner structure comprising the first attachment component, wherein the inner structure is inserted into the outer structure to expand the third attachment component outward.

EEE 14 is the apparatus of EEE 13, wherein the outer structure comprises one or more protrusions configured to: resist movement of a protrusion of the inner structure past the one or more protrusions in response to an axial force applied to the inner structure of magnitude that is less than a predetermined threshold; and allow movement of the protrusion of the inner structure past the one or more protrusions in response to an axial force applied to the inner structure of magnitude that is greater than the predetermined threshold.

EEE 15 is the apparatus of EEE 13, wherein the outer structure comprises one or more protrusions configured to prevent movement of the second attachment component beyond the one or more protrusions.

EEE 16 is the apparatus of EEE 13, wherein the third attachment component comprises: one or more first faces that are configured to be substantially parallel to a perimeter of the hole; and one or more second faces that are substantially perpendicular to respective faces of the one or more first faces.

EEE 17 is the apparatus of EEE 13, wherein the third attachment component comprises two or more tabs that are separated by one or more gaps.

EEE 18 is the apparatus of EEE 17, wherein the one or more gaps are configured to receive one or more respective tabs of the inner structure.

EEE 19 is the apparatus of EEE 13, wherein the first attachment component comprises two or more sections that are separated by one or more gaps.

EEE 20 is a method for attaching an electrical component to a composite sandwich panel, the method comprising: positioning an insert within a hole in a composite sandwich panel, wherein a facing of the composite sandwich panel comprises electrical circuitry thereon, and wherein the insert comprises a first attachment component; and pressing a cap onto the facing such that the first attachment component of the insert attaches to a second attachment component of the cap through the hole, thereby pressing an electrical component against the electrical circuitry on the facing to electrically couple the electrical component to the electrical circuitry and mechanically couple the electrical component to the facing.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to explain the principles of the embodiments, the practical application, and to enable others of ordinary skill in the art to understand the disclosure for various embodiments with various modifications as are suited to the particular use contemplated.

What is claimed is:

1. An assembly comprising:
    a composite sandwich panel comprising:
        a first facing;
        a second facing;
        a core structure that extends between the first facing and the second facing;
        a hole that extends between the first facing and the second facing, the core structure defining a perimeter of the hole; and
        electrical circuitry on the first facing;
    an electrical component;
    an insert that is positioned within the hole, the insert comprising a first attachment component within the hole; and
    a cap comprising a second attachment component that is releasably attachable to the first attachment component within the hole to electrically couple the electrical component to the electrical circuitry and mechanically couple the electrical component to the first facing.

2. The assembly of claim 1, wherein the first attachment component comprises a ridge that at least partially encircles a longitudinal axis of the insert, and wherein the second attachment component comprises two or more tabs configured to be placed under respective portions of the ridge and to exert a radial force directed away from the longitudinal axis.

3. The assembly of claim 1, wherein the insert comprises:
    an outer structure comprising a third attachment component; and
    an inner structure comprising the first attachment component, wherein the inner structure is inserted into the outer structure to expand the third attachment component outward against the perimeter of the hole.

4. The assembly of claim 3, wherein the outer structure comprises one or more gaps receiving one or more respective tabs of the inner structure.

5. The assembly of claim 3, further comprising a lens, wherein the inner structure comprises a second hole that is opposite the first attachment component, wherein the electrical component comprises a light source, and wherein the inner structure houses the lens such that the light source is optically coupled to the lens, and the lens is optically coupled to the second hole opposite the first attachment component.

6. The assembly of claim 1, wherein the first attachment component and the second attachment component are configured to form a snap joint.

7. The assembly of claim 1, wherein the insert comprises two or more arms opposite the first attachment component that are compressed against the second facing.

8. The assembly of claim 7, wherein an arm of the two or more arms comprises two or more prongs.

9. The assembly of claim 7, wherein the composite sandwich panel comprises a honeycomb core between the first facing and the second facing.

10. The assembly of claim 1, wherein the electrical component comprises a light source, a light emitting diode (LED), a sensor, a button, a switch, a microcontroller, a wireless communication device, a battery, or an actuator.

11. The assembly of claim 1, wherein the electrical circuitry is on a side of the first facing that faces away from the core structure and the second facing.

12. The assembly of claim 1, wherein the electrical circuitry has been printed on the first facing.

13. An apparatus for attaching an electrical component to a composite sandwich panel, the apparatus comprising:
    an insert comprising a first attachment component having a ridge that at least partially encircles a longitudinal axis of the apparatus; and
    a cap comprising a second attachment component that is releasably attachable to the first attachment component through a hole in the composite sandwich panel inside of which the insert is positioned, wherein the second attachment component comprises two or more tabs configured to be placed under respective portions of the ridge and to exert a radial force directed away from the longitudinal axis,
    wherein the insert further comprises:
    an outer structure comprising a third attachment component; and
    an inner structure comprising the first attachment component, wherein the inner structure is configured for insertion into the outer structure to expand the third attachment component outward.

14. The apparatus of claim 13, wherein the outer structure comprises one or more protrusions configured to:
    resist movement of a protrusion of the inner structure past the one or more protrusions in response to an axial force applied to the inner structure of magnitude that is less than a predetermined threshold; and
    allow movement of the protrusion of the inner structure past the one or more protrusions in response to an axial force applied to the inner structure of magnitude that is greater than the predetermined threshold.

15. The apparatus of claim 13, wherein the outer structure comprises one or more protrusions configured to prevent movement of the second attachment component beyond the one or more protrusions.

16. The apparatus of claim 13, wherein the third attachment component comprises:
   one or more first faces that are configured to be substantially parallel to a perimeter of the hole; and
   one or more second faces that are substantially perpendicular to respective faces of the one or more first faces.

17. The apparatus of claim 13, wherein the third attachment component comprises four tabs that are separated by four gaps, the four tabs and the four gaps having rotational symmetry about the longitudinal axis.

18. The apparatus of claim 17, wherein the one or more gaps are configured to receive one or more respective tabs of the inner structure.

19. The apparatus of claim 13, wherein the inner structure is configured for insertion into the outer structure such that the first attachment component contacts a face of the outer structure that is opposite a face of the third attachment component.

20. A method for attaching an electrical component to a composite sandwich panel, the method comprising:

positioning an insert within a hole in the composite sandwich panel, wherein the composite sandwich panel includes a first facing comprising electrical circuitry thereon, wherein the composite sandwich panel includes a core structure between the first facing and a second facing of the composite sandwich panel, the core structure defining a perimeter of the hole, and wherein the insert comprises a first attachment component; and pressing a cap onto the facing such that the first attachment component of the insert attaches to a second attachment component of the cap through the hole, thereby pressing the electrical component against the electrical circuitry on the first facing to electrically couple the electrical component to the electrical circuitry and mechanically couple the electrical component to the first facing.

\* \* \* \* \*